United States Patent
Yang

[11] Patent Number: 6,114,073
[45] Date of Patent: Sep. 5, 2000

[54] METHOD FOR REPAIRING PHASE SHIFTING MASKS

[75] Inventor: Baorui Yang, Pflugerville, Tex.

[73] Assignee: Micron Technology, Inc., Boise, Id.

[21] Appl. No.: 09/220,892

[22] Filed: Dec. 28, 1998

[51] Int. Cl.[7] .............................. G03F 9/00; C23C 14/00; C23C 14/32
[52] U.S. Cl. .......................................... 430/5; 204/192.34
[58] Field of Search ................................ 430/5, 322, 323; 378/35; 216/62, 63; 204/192.34, 298.36

[56] References Cited

U.S. PATENT DOCUMENTS

| | | | |
|---|---|---|---|
| 4,851,097 | 7/1989 | Hattori et al. | 204/192.33 |
| 5,035,787 | 7/1991 | Parker et al. | 204/192.34 |
| 5,085,957 | 2/1992 | Hosono | 430/5 |
| 5,165,954 | 11/1992 | Parker et al. | 427/526 |
| 5,246,801 | 9/1993 | Pierrat | 430/5 |
| 5,272,116 | 12/1993 | Hosono | 437/228 |
| 5,357,116 | 10/1994 | Talbot et al. | 250/492.21 |
| 5,382,484 | 1/1995 | Hosono | 430/5 |
| 5,405,721 | 4/1995 | Pierrat | 430/5 |
| 5,482,802 | 1/1996 | Celler et al. | 430/5 |
| 5,576,126 | 11/1996 | Rolfson | 430/5 |
| 5,582,939 | 12/1996 | Pierrat | 430/5 |
| 5,635,315 | 6/1997 | Mitsui | 430/5 |
| 5,695,896 | 12/1997 | Pierrat | 430/5 |
| 5,759,724 | 6/1998 | Rolson | 430/5 |
| 5,795,685 | 8/1998 | Liebmann et al. | 430/5 |

OTHER PUBLICATIONS

Y. Satoh et al., "Performance of Gas Assist FIB Repair for Opaque Defects", SPIE, vol. 2884, pp. 124–137.

Seiko Instrument, Inc. Scientific Instrument Division, SIR–3000, Photomask Repair System, Operation Manual.

*Primary Examiner*—S. Rosasco
*Attorney, Agent, or Firm*—Dickstein Shapiro Morin & Oshinsky LLP

[57] ABSTRACT

A method of repairing opaque defects on a phase shifting template such as a mask or reticle that includes the steps of directing a focused ion beam (FIB) to scan a small region including an opaque defect. By monitoring a change in the intensity of a secondary signal, the end of the etching process is detected, and the template is exposed to a strongly basic solution to remove ion stains and repair residue produced by the FIB sputtering process. Suitable bases include sodium hydroxide, potassium hydroxide, ammonium hydroxide, tetramethyl ammonium hydroxide, and the like. According to this method, an opaque defect is removed with high accuracy of edge placement and high quality of geometry reconstruction, and the phase shifting amount and the transmission of the opaque defect area are adjusted to their proper levels with high precision.

41 Claims, 4 Drawing Sheets

METHOD FOR REPAIRING PHASE SHIFTING MASKS

FIELD OF THE INVENTION

The present invention relates generally to a method for repairing a template used in optical lithography, and in particular to a method for repairing opaque defects on a phase shifting template, such as a mask or reticle, which is used in a lithographic process for the manufacture of semiconductor elements.

BACKGROUND OF THE INVENTION

In the manufacture of semiconductor wafers, microlithography is used to pattern various layers on a wafer. A layer of resist is deposited on the wafer and exposed using an exposure tool and a template such as a mask or reticle. During the exposure process a form of radiant energy such as ultraviolet light is directed through the template to selectively expose the resist in a desired pattern. The resist is then developed to remove either the exposed portions for a positive resist or the unexposed portions for a negative resist, thereby forming a resist mask on the wafer. The resist mask can then be used to protect underlying areas of the wafer during subsequent fabrication processes, such as deposition, etching, or ion implantation processes.

Manufacturers in the field of integrated circuits (ICs) have been trying to reduce the geometric size of the devices (e.g., transistors or polygates) present on integrated circuits. The benefits achieved by reducing device dimensions include higher performance and smaller packaging sizes. Improving lithographic techniques provides improved resolution and results in a potential reduction of the minimum dimension. However, at small geometries, diffraction effects such as proximity effects, poor subject contrast, and poor resolution result, producing wafers with incomplete or erroneous circuit patterns.

A lithographic technique useful at small geometries is known as phase shifting lithography. In phase shifting lithography, the interference between waves of an exposure energy is used to overcome diffraction effects and to improve the resolution and depth of optical images projected onto a target. Phase shifting lithography involves controlling the phase of an exposure light at the target such that adjacent bright areas are formed preferably 180 degrees out of phase with one another. Dark regions are thus produced between the bright areas by destructive interference even when diffraction would otherwise cause these areas to be lit. This technique improves total resolution at the target (i.e., wafer) and allows resolutions as fine as 0.10 microns to occur.

In the past, phase shifting templates have been used experimentally to print submicron features. Phase shifting lithography is still in the research and development stage, however, and has not been used extensively for commercial volume semiconductor manufacture. One reason phase shifting lithography is not widely used commercially is the high defect density which results during its manufacture. Phase shifting templates are difficult to form without defects and any defects on the template may be printed onto the target. In addition, an individual reticle costs in the range of $10,000 to $20,000 and typically requires up to two weeks to manufacture. Mask production likewise involves substantial time and expense. The complete circuit patterning for a modern IC will typically require 10 to 20 or more reticles.

The most common template defects are pattern distortions of two types: opaque defects and clear defects. Reticles and masks typically consist of an opaque thin film of metal or metal silicide, such as chromium or molybdenum silicide, deposited in a pattern on a transparent substrate of quartz, glass, or fused silica. Opaque defects, which may occur as spots, pattern extensions, bridges between adjacent patterns, or the like, are the result of opaque material such as chromium or molybdenum silicide being present in a non-pattern area. Clear defects, which generally occur as pinholes, missing parts, or breaks in the pattern, are the result of missing or inadequate layers of opaque material in a pattern area on the template.

Focused ion beams (FIBs) have been used for repair of optical masks and reticles since the mid-1980s. The ability of the FIB to accurately remove unwanted portions of the metal film and to deposit material to "edit" the pattern makes it potentially an almost ideal repair tool. A FIB exposes a template to a beam of positively charged ions, typically gallium ions, via an optic system. When a template is exposed to the ion beam, secondary ions are produced, and may be detected by the FIB machine and monitored to determine the progress of repair work. If a chromium pattern is exposed, secondary chromium ions are generated, and if a silicon, glass, or molybdenum silicide pattern is exposed, secondary silicon ions are generated.

Sputtering with a scanning FIB is the preferred method of opaque defect repair at small geometries, but FIB sputtering has several disadvantages. First, difficulty in precisely determining the endpoint when etching molybdenum silicide films leads to overetching and subsequent recess formation in the template substrate, which affects the phase shifting amount and may cause transmission error. Second, the high energy (25 to 50 KeV) FIB beams used cause significant template damage during repair due to the beam's high sputter rate. In addition, significant amounts of ions from the ion beam are implanted into the template substrate during imaging and opaque defect repair, resulting in an effect called "ion staining" or "gallium staining", when a gallium ion beam is used. This effect causes local reductions of the substrate's transparency which may print on the semiconductor wafer, and/or may be identified erroneously as defects by industry-standard mask inspection equipment.

There is needed, therefore, a method of repairing opaque defects on a phase shifting template that reduces or prevents overetching, and that reduces damage caused by ion staining.

SUMMARY OF THE INVENTION

The present invention provides a method for repairing opaque defects on a lithographic template by focused ion beam sputtering. A secondary signal, which may be a silicon ion signal if a metal silicide defect is being sputtered, is generated by the sputtering and is monitored so that the sputtering process can be stopped as soon as the defect has been removed and the substrate exposed. The template may then be exposed to a strong base to remove any ion stains and residue from the template. The strong base may be sodium hydroxide, ammonium hydroxide or the like, but is preferably sodium hydroxide.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. The following detailed description is, therefore, not to be taken in a limiting sense, and the scope of the present invention is defined by the appended claims.

Figure 1:
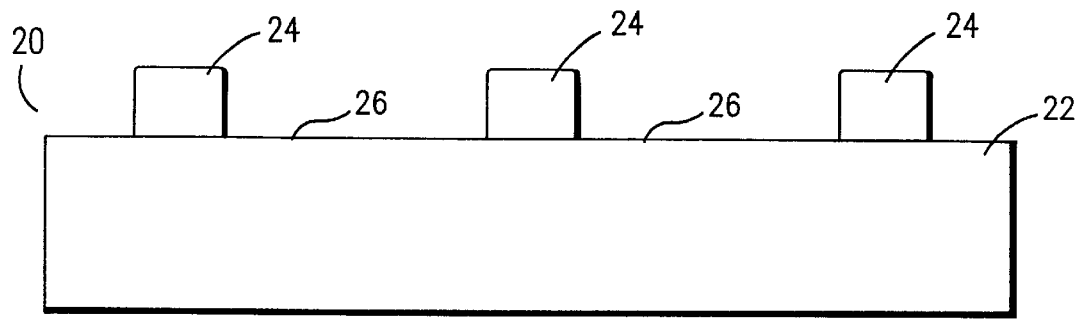
FIG. 1 is a cross-sectional view of a representative lithographic template.

Referring now to the drawings, where like elements are designated by like reference numerals, an exemplary lithographic template 20 is shown in FIG. 1. The lithographic template 20 may be a photomask, x-ray mask, reticle, or other similar structure having similar features. The lithographic template comprises a transparent substrate 22, a light translucent portion 24 formed and patterned on the transparent substrate 22, and a light transmitting portion 26. The transparent substrate 22 is made of silica glass, borosilicate glass, quartz, or the like, and is typically a 6 by 6 inch square having a thickness of approximately 0.25 inches, although the size and thickness may vary. The light translucent portion 24 typically comprises a thin film made of a material containing metal and silicon as its main components, and which may additionally contain oxygen or oxygen and nitrogen. The metal may be molybdenum, tantalum, or tungsten, and the film may be a metal silicide, metal oxysilicide, metal oxynitrosilicide, or other similar compound. For exemplary purposes, the light translucent portion 24 is described as being a molybdenum silicide film. Additional films or opaque materials such as chromium-containing layers may be present on the template 20 as well.

The thickness of the light translucent portion 24 is adjusted depending on the composition of the light translucent portion 24 so that phase shifting within the range of 160 to 200 degrees and light transmission within the range of 2 to 20 percent are achieved. Preferably, the phase shifting amount is 180 degrees and the light transmission is approximately 8 to 12 percent. At the preferred transmission levels, the light translucent portion 24 has both a light shielding function and a phase shifting function, obviating the need to separately form a light shielding film and a phase shifting film. The thickness may be adjusted according to the equation $d=(\phi/360)\times[\lambda/(n-1)]$, where d is the thickness of the light translucent portion 24, $\phi$ is a predetermined phase shifting amount, $\lambda$ is the wavelength of light with which the lithographic template 20 will be used, and n is the refractive index of the material of the light translucent portion 24.

Figure 2:
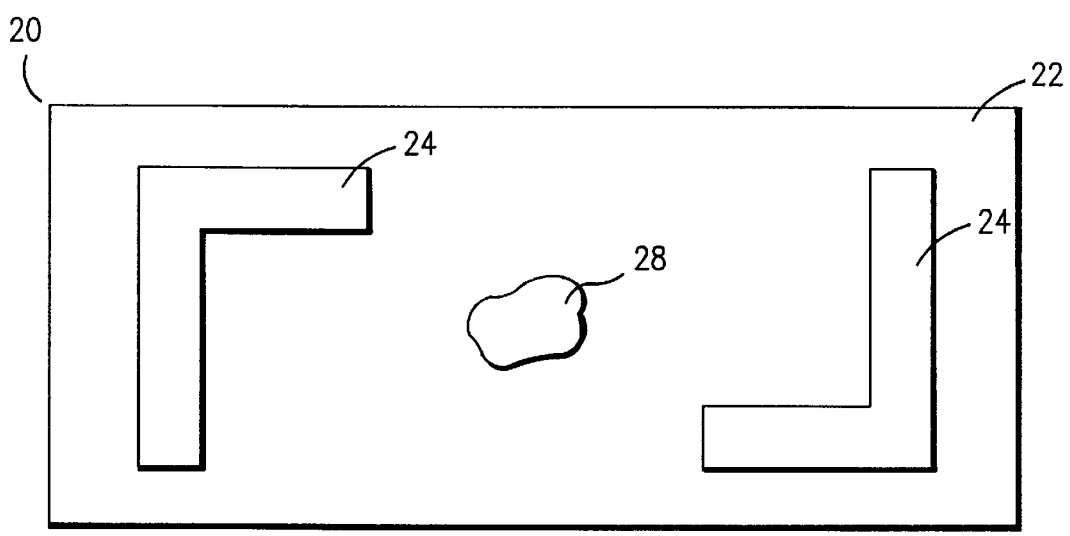
FIG. 2 is a top view of a lithographic template undergoing the process of a preferred embodiment of the invention.
Figure 3:
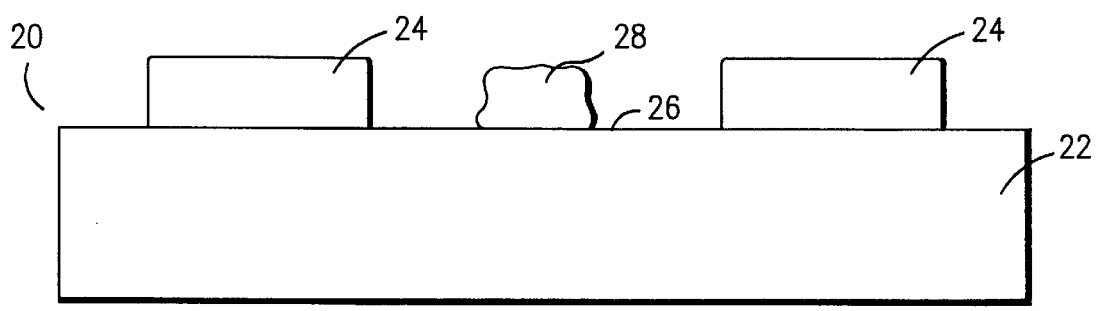
FIG. 3 is a side view of the template of FIG. 2.

A lithographic template 20 having an opaque defect 28 thereon is shown in FIGS. 2 and 3. To remove the opaque defect, the template 20 is placed in the vacuum chamber (not shown) of a FIB system. Only a FIB system which has the capability of detecting $Si^+$ secondary ion signals may be utilized, such as a Seiko SIR-3000 system manufactured by Seiko Instrument Inc. Such systems typically have an irradiation energy within the range of 25 to 30 KeV, and a beam current of approximately 40 to 300 pA. Before sputtering of defects is begun, an endpoint signal is determined by test sputtering in a non-critical area to calculate the secondary ion signal level corresponding to the desired endpoint or stop point.

Figure 4:
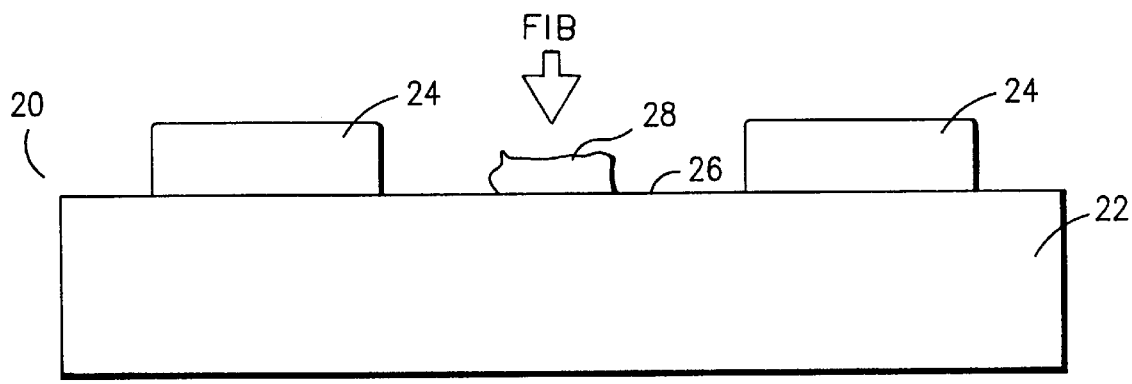
FIG. 4 shows the template of FIG. 2 at a processing step subsequent to that shown in FIGS. 2 and 3.
Figure 5:
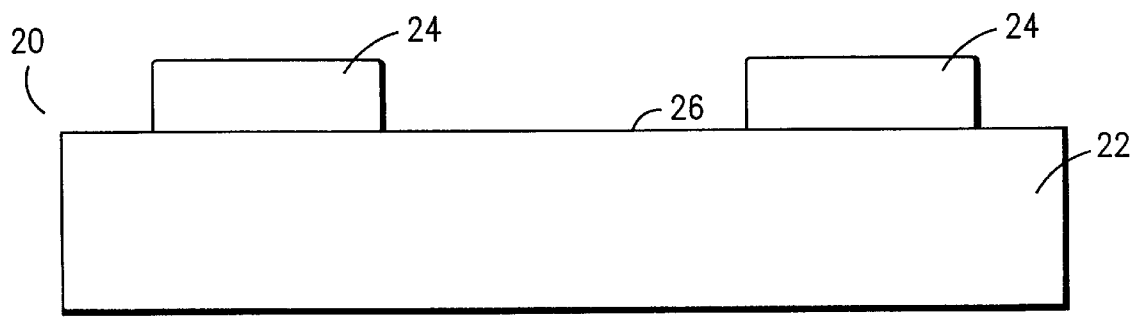
FIG. 5 shows the template of FIG. 2 at a processing step subsequent to that shown in FIG. 4.

Referring now to FIG. 4, the ion beam is focused on the opaque defect 28, and sputtering is begun. The secondary ion signal level is monitored simultaneously with the sputtering process, so that when the endpoint signal is detected, sputtering may be immediately halted. As shown in FIG. 5, the MoSi opaque defect has been removed. However, a thin film residue 40 is left. Ion stains are also present on the template 20 in the repair area 28. The residue 40 and $Ga^+$ ion stains result in phase error and reduced transmission.

Figure 6:
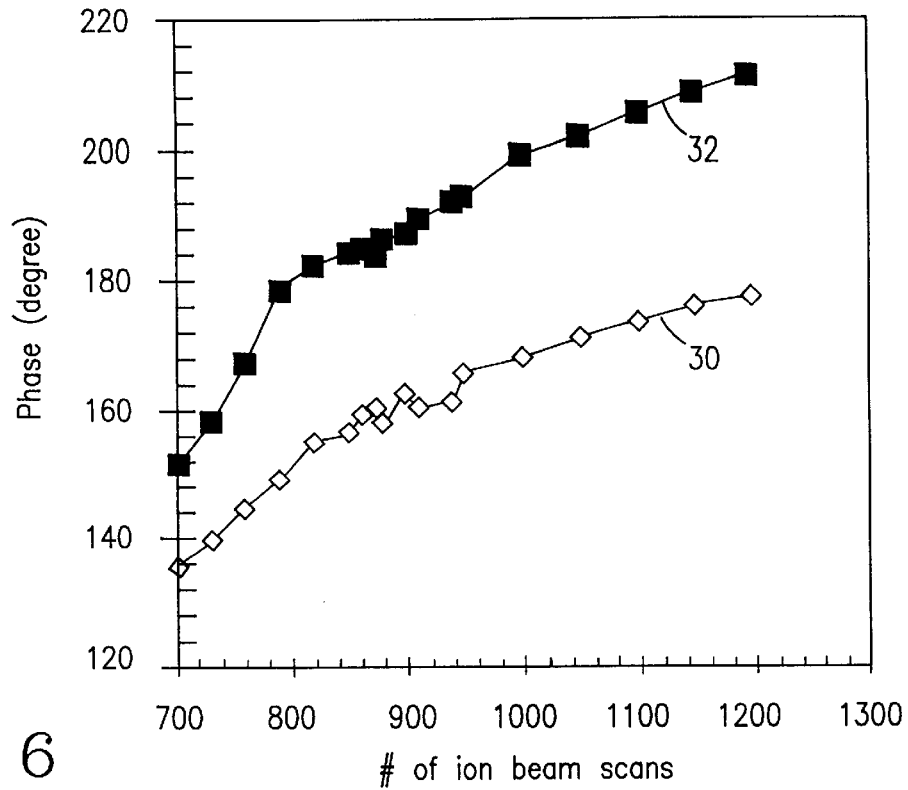
FIG. 6 is a graph depicting the phase angle measurement of the template of FIG. 5.
Figure 7:
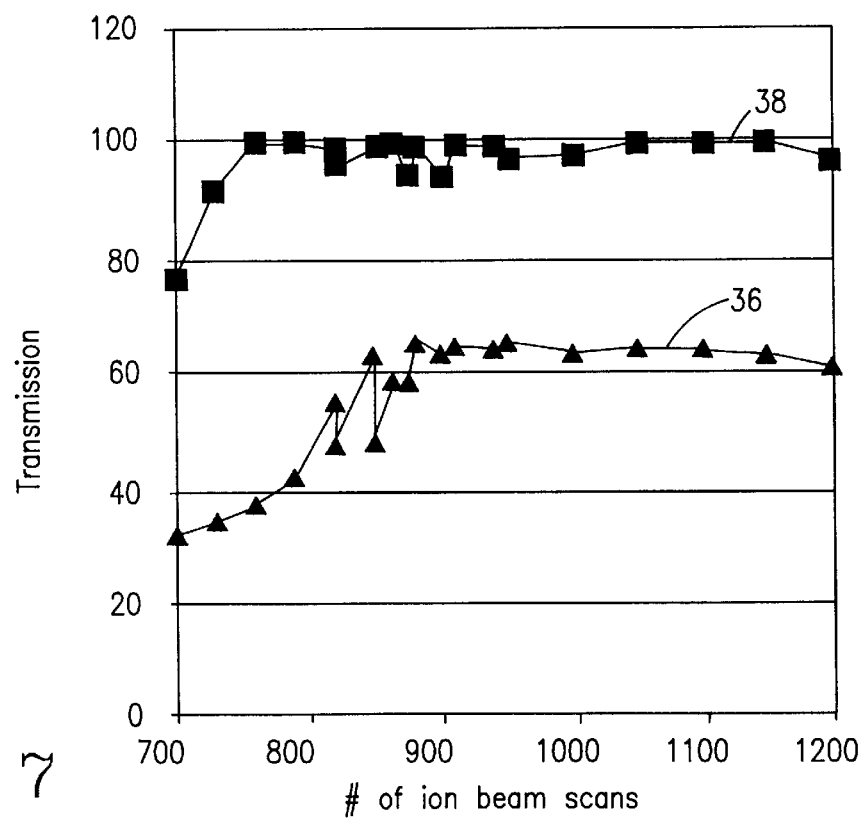
FIG. 7 is a graph depicting the transmission measurement of the template of FIG. 5.

As shown in FIGS. 6 and 7, after the sputtering process has been concluded (end point at 800 beam scans), there is still a phase error of approximately 20 to 40 degrees in the repair area 28 that has ion stains and other material, as shown by data curve 30. Transmission is also reduced to approximately 40 to 60 percent of optimal transmission levels, as shown by data curve 36 in FIG. 7. The data in FIGS. 6 and 7 were measured by etching a square hole on the MoSi film. Before further processing is undertaken, any clear errors (not shown) may be repaired by depositing a carbon film on the defect, by methods known in the art.

Figure 8:
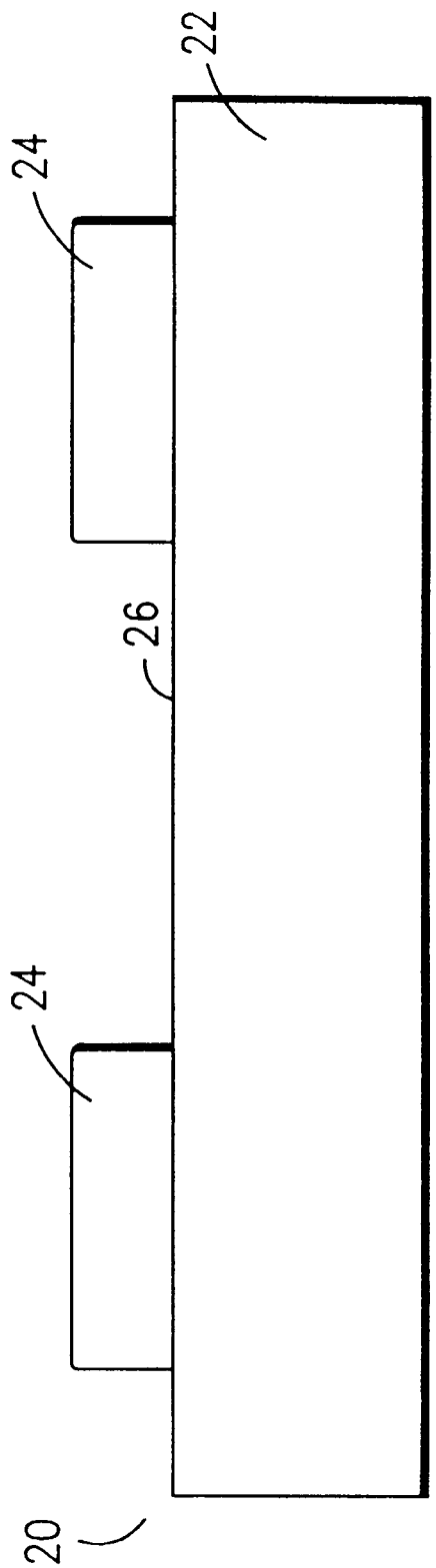
FIG. 8 shows the template of FIG. 2 at a processing step subsequent to that shown in FIG. 5.

Any remains ion stains and residue 40 may then be removed by exposing the template 20 to an aqueous solution of a strong base, resulting in the structure shown in FIG. 8. Suitable bases include sodium hydroxide, potassium hydroxide, ammonium hydroxide, tetramethyl ammonium hydroxide, and the like. Preferably sodium hydroxide is used. The solution should comprise approximately 3 to 4 percent sodium hydroxide in water, or should be of an equivalent strength if another base is used. The sodium hydroxide solution is heated to a temperature of approximately 80 degrees Celsius, and the template is exposed to this solution by wet etching means such as immersion or spray etching, for a period of time within the range of approximately 1 to 5 minutes. Preferably the exposure time is approximately 2 minutes, but it should be understood that the exposure time will vary according to the strength of the basic solution utilized. After the exposure step, the ion stains and residue have been removed, and it can be seen by referring to data curves 32 and 38 in FIGS. 6 and 7 that the phase error has been virtually eliminated, and a transmission level of approximately 100 percent of the ideal transmission has been achieved. The sodium hydroxide etching process has also been optimized to minimize the damage to the MoSi film.

As can be seen by the embodiments described herein, the present invention encompasses an opaque defect repair method for a lithographic template. The method uses focused ion beam sputtering, followed by a treatment with a strong base such as sodium hydroxide to remove ion stains and repair residue. This process has the advantage of avoiding overetching and reducing the undesirable effects of ion stains caused by the FIB process.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method for removing an opaque defect from a lithographic template comprising the steps of:
    providing a lithographic template having a substrate layer and a patterned metal silicide layer on the substrate layer;
    directing a focused ion beam at an opaque defect on the template until a predetermined secondary signal is detected from the template;
    exposing the template to a basic solution.

2. The method of claim 1, further comprising a step of repairing a clear defect by depositing a carbon film on the clear defect.

3. The method of claim 2, wherein said repair step is performed prior to said exposure step.

4. The method of claim 1, wherein the metal silicide comprises a metal selected from the group consisting of molybdenum, tantalum, and tungsten.

5. The method of claim 4, wherein the metal silicide includes nitrogen.

6. The method of claim 1, wherein the metal silicide includes oxygen.

7. The method of claim 1, wherein the lithographic template further comprises a chrome layer on the patterned metal silicide layer.

8. The method of claim 1, wherein the secondary signal is a silicon ion signal.

9. The method of claim 1, wherein the basic solution is a sodium hydroxide solution.

10. The method of claim 1, wherein the basic solution is an ammonium hydroxide solution.

11. The method of claim 1, wherein the basic solution is a potassium hydroxide solution.

12. The method of claim 1, wherein the basic solution is a tetramethylammonium hydroxide solution.

13. The method of claim 1, wherein said exposure step comprises immersion etching.

14. The method of claim 1, wherein said exposure step comprises spray etching.

15. The method of claim 1, wherein the lithographic template is a mask.

16. The method of claim 1, wherein the lithographic template is a reticle.

17. A method for removing an opaque defect from a lithographic template comprising the steps of:
    providing a lithographic template having a substrate layer and a patterned metal silicide layer on the substrate layer;
    directing a focused ion beam at an opaque defect on the template while monitoring a silicon ion signal obtained from the template;
    ceasing said directing step when the silicon ion signal indicates that the substrate layer of the template is exposed; and
    contacting the template with a sodium hydroxide solution.

18. The method of claim 17, further comprising a step of repairing a clear defect by depositing a carbon film on the clear defect.

19. The method of claim 18, wherein said repair step is performed prior to said contacting step.

20. The method of claim 17, wherein the metal silicide layer is a layer of molybdenum silicide.

21. The method of claim 17, wherein the metal silicide layer is a layer of tantalum silicide.

22. The method of claim 17, wherein the metal silicide layer is a layer of tungsten silicide.

23. The method of claim 17, wherein the lithographic template further comprises a chrome layer on the patterned metal silicide layer.

24. The method of claim 17, wherein said contacting step is carried out for a time within the range of approximately 1 to 5 minutes.

25. The method of claim 24, wherein the time is approximately 2 minutes.

26. The method of claim 17, wherein the sodium hydroxide solution comprises approximately 3 to 4 percent sodium hydroxide in water.

27. The method of claim 17, wherein the sodium hydroxide solution is at a temperature of approximately 80 degrees Celsius.

28. The method of claim 17, wherein said contacting step comprises immersion etching.

29. The method of claim 17, wherein said contacting step comprises spray etching.

30. The method of claim 17, wherein the lithographic template is a mask.

31. The method of claim 17, wherein the lithographic template is a reticle.

32. A method for removing an opaque defect from a lithographic template, comprising the steps of:
    providing a lithographic template having a substrate layer and a patterned molybdenum silicide layer on the substrate layer;
    directing a focused ion beam at an opaque defect on the template until a secondary silicon ion signal obtained from the template indicates that the substrate layer of the template is exposed; and
    etching the template with a sodium hydroxide solution.

33. The method of claim 32, further comprising a step of repairing a clear defect by depositing a carbon film on the clear defect, wherein said repair step is performed prior to said etching step.

34. The method of claim 32, wherein the sodium hydroxide solution comprises approximately 3 to 4 percent sodium hydroxide in water.

35. The method of claim 34, wherein said etching step is carried out for a time within the range of approximately 1 to 5 minutes.

36. The method of claim 35, wherein the time is approximately 2 minutes.

37. The method of claim 32, wherein the sodium hydroxide solution is at a temperature of approximately 80 degrees Celsius.

38. The method of claim 32, wherein said etching step comprises immersion etching.

39. The method of claim 32, wherein said etching step comprises spray etching.

40. The method of claim 32, wherein the lithographic template is a mask.

41. The method of claim 32, wherein the lithographic template is a reticle.

* * * * *